(12) United States Patent
Guzzi et al.

(10) Patent No.: US 8,169,827 B2
(45) Date of Patent: May 1, 2012

(54) NAND FLASH MEMORY STRING APPARATUS AND METHODS OF OPERATION THEREOF

(75) Inventors: Pietro Guzzi, Milan (IT); Angelo Visconti, Appiano Gentile (IT)

(73) Assignee: Hynix Semiconductor Inc., Gyeonggi-do (KR)

( * ) Notice: Subject to any disclaimer, the term of this patent is extended or adjusted under 35 U.S.C. 154(b) by 576 days.

(21) Appl. No.: 12/390,339

(22) Filed: Feb. 20, 2009

(65) Prior Publication Data
US 2010/0214839 A1    Aug. 26, 2010

(51) Int. Cl.
*G11C 11/34* (2006.01)
(52) U.S. Cl. .................. 365/185.17; 365/185.24
(58) Field of Classification Search .......... None
See application file for complete search history.

(56) References Cited

U.S. PATENT DOCUMENTS

| | | | | |
|---|---|---|---|---|
| 5,698,879 | A | * | 12/1997 | Aritome et al. ............... 257/315 |
| 5,844,841 | A | * | 12/1998 | Takeuchi et al. .......... 365/185.03 |
| 7,061,044 | B2 | * | 6/2006 | Park et al. ..................... 257/319 |
| 7,283,392 | B2 | * | 10/2007 | Lee ........................... 365/185.17 |
| 7,433,231 | B2 | * | 10/2008 | Aritome .................... 365/185.17 |
| 7,649,777 | B2 | * | 1/2010 | Ichige et al. .............. 365/185.17 |
| 2007/0210372 | A1 | * | 9/2007 | Park et al. ..................... 257/321 |

* cited by examiner

*Primary Examiner* — Alexander Sofocleous
(74) *Attorney, Agent, or Firm* — William Park & Associates Ltd.

(57) ABSTRACT

A NAND string, its operation, and manufacture is described herein. The NAND string includes one or more memory cells, a first selection transistor coupled to the memory cells, and a second selection transistor coupled between the memory cell and the first selection transistor, wherein the second selection transistor has a process defined threshold voltage.

10 Claims, 16 Drawing Sheets

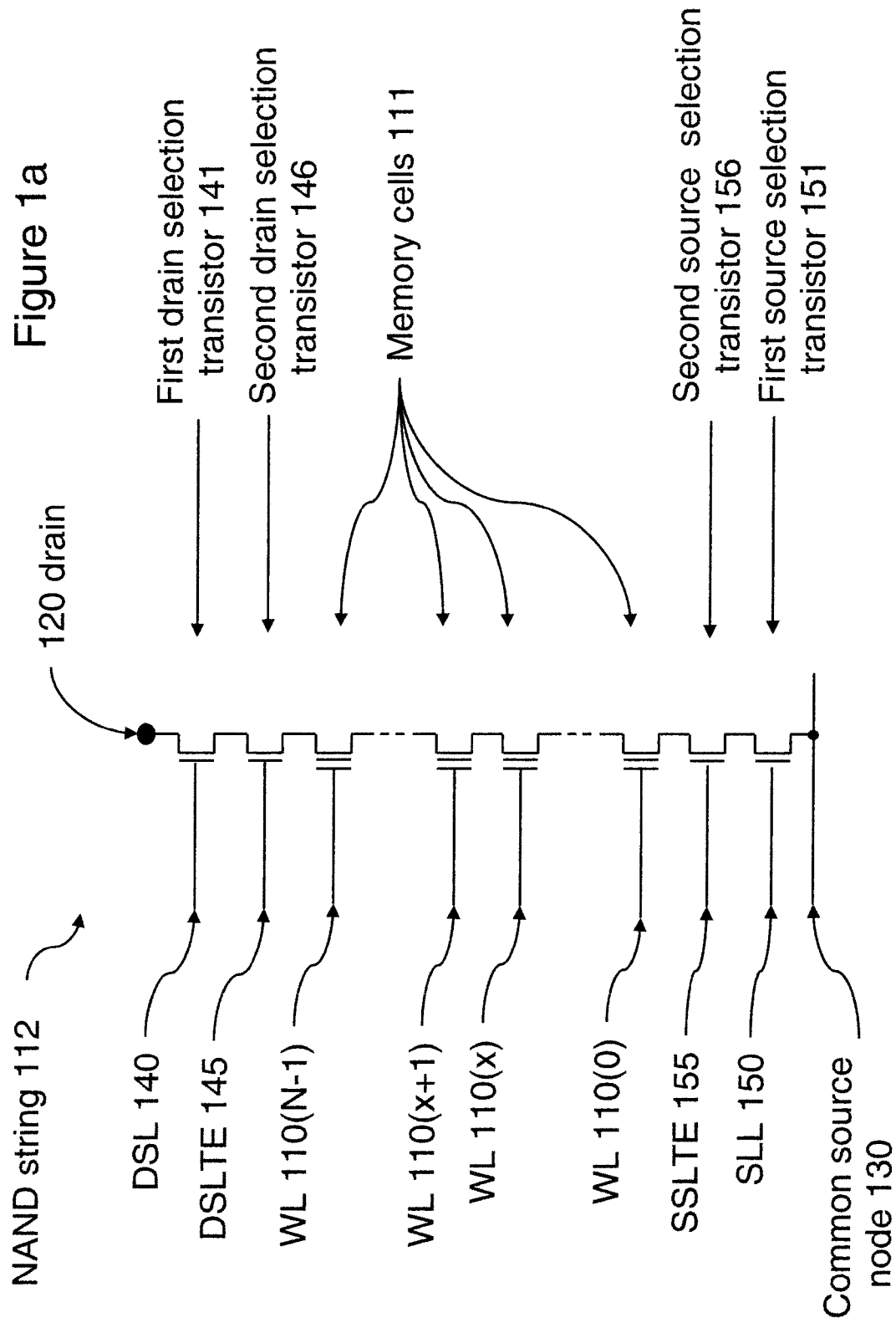

Cross section I-I

Cross section II-II

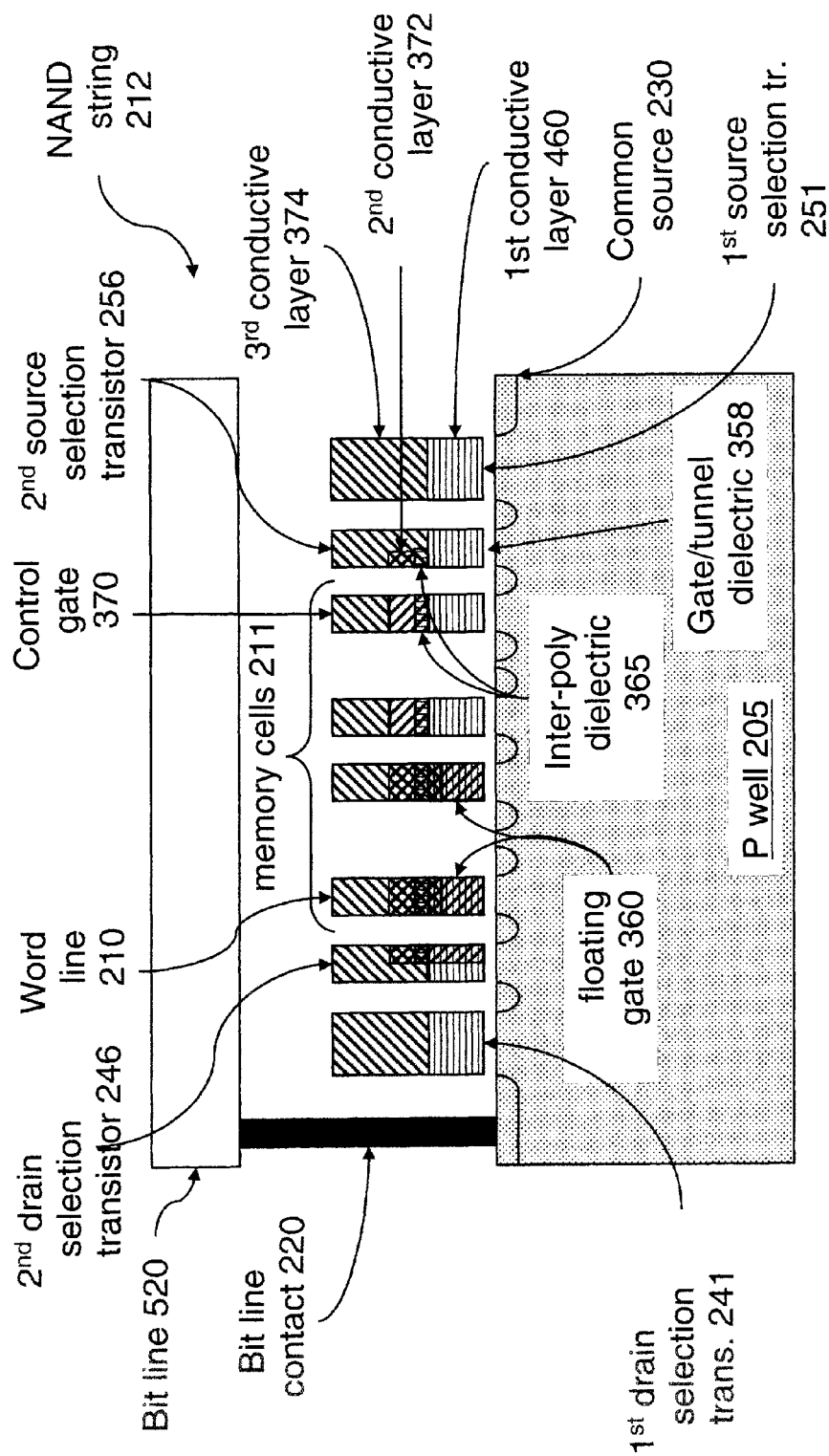
Figure 5   Cross section III-III

NAND FLASH MEMORY STRING APPARATUS AND METHODS OF OPERATION THEREOF

TECHNICAL FIELD

The present invention relates to integrated circuits including non-volatile memory and more specifically non-volatile memory with NAND architecture.

BACKGROUND OF THE INVENTION

Memory devices are becoming more popular and correspondingly an increasing request for devices with larger density is present. One approach to address this need is to produce highly compact memory devices with the most advanced technology, so as to reduce the overall unit cost. Memories with NAND architecture are very compact and therefore ideal for the production of high density memory devices.

With the progress of technology, increasingly smaller features sizes are achievable, both in terms of line width and spacing, as well as the minimum dimension of elementary components. Such a continuous miniaturization process in silicon-based technologies emphasizes some limitations that were not relevant in past generations. For example, the functionality of NAND devices becomes less reliable because of programming disturbances that affect word lines that are spaced apart by very small distances.

Moreover, the manufacturing process control becomes so stringent that it becomes difficult to create memory cells with the same performances, especially when they are near to a border or to a non-periodic feature of a memory array. In present day NAND memory devices, the immediate neighborhood of memory cells closest to the source selection and drain selection lines are different from all other memory cells in the NAND string. It is extremely difficult to account for such a difference in a controlled way, therefore the electrical behavior of these memory cells may differ from all others and create undesired functions of the electronic NAND memory devices.

BRIEF DESCRIPTION OF THE DRAWINGS

The features and advantages of the present invention will be made apparent by the following detailed description of some embodiments thereof, illustrated merely by way of non-limiting examples in the annexed drawings, wherein:

FIG. 1a illustrates a schematic view of a portion of a memory array with NAND architecture according to an embodiment of the invention.

FIG. 2a illustrates a partial top view of a portion of the memory array of FIG. 1a.

FIG. 5 illustrates a cross section along line III-III in FIG. 2.

DETAILED DESCRIPTION OF THE INVENTION

Exemplary NAND String Architecture

Figure 1B:
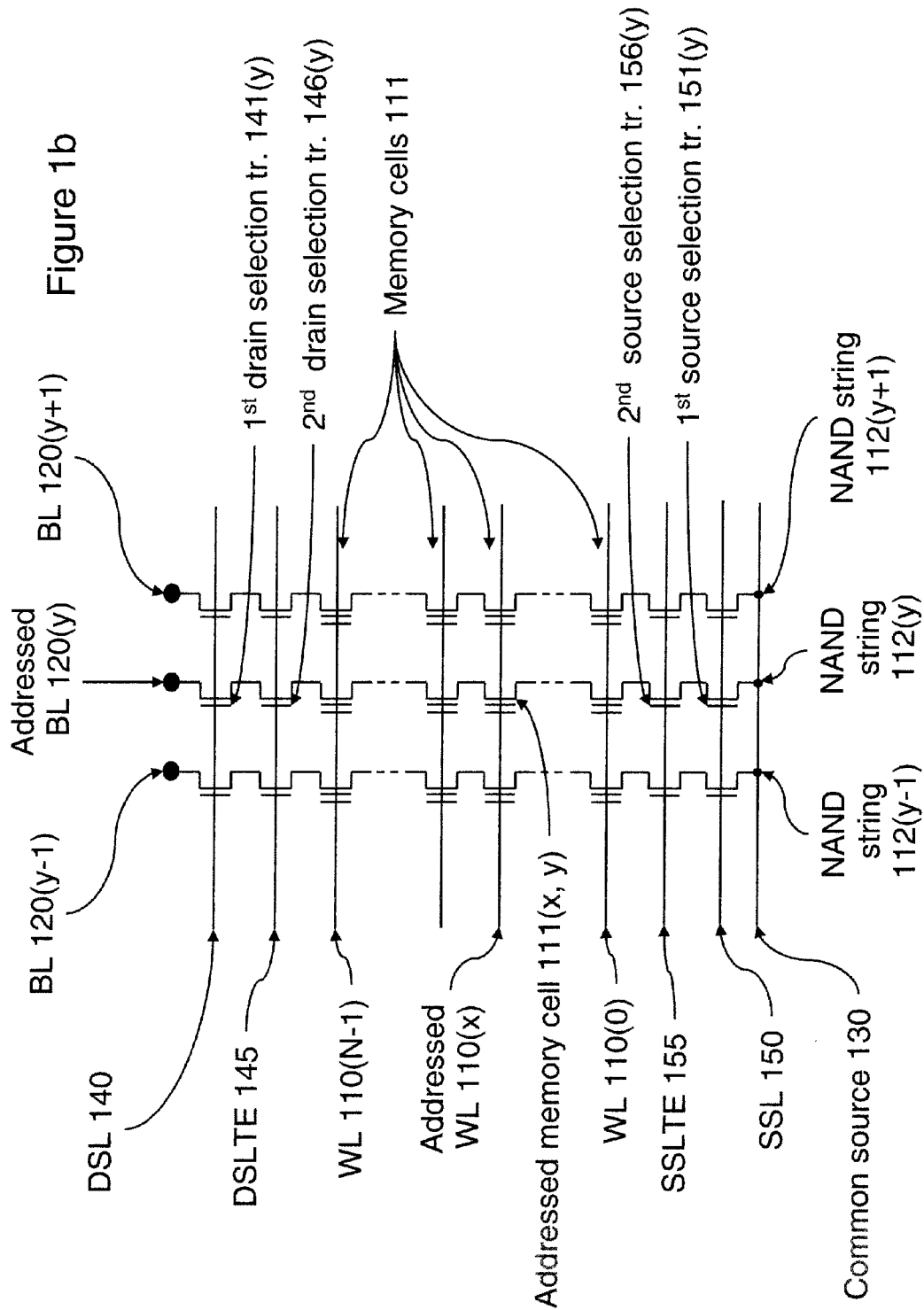
FIG. 1b illustrates a schematic view of a portion of a memory array with NAND architecture according to an embodiment of the invention.

FIG. 1a illustrates a schematic view of a portion of a memory array with NAND architecture according to an embodiment. For simplicity, the portion displayed in FIG. 1a only illustrates one NAND string 112. A memory array typically includes a plurality of NAND strings 112 that are side-by-side in rows, forming a block with shared word lines, and blocks are placed side-by-side along the vertical direction, sharing columns (bit lines). Each NAND string is connected to a respective column (bit line) at drain terminal nodes 120. Each NAND string is also connected to common source node 130.

The NAND string 112 includes a plurality of non-volatile memory cells 111 which are serially organized such that an electric path between the drain terminal 120 and the common source node 130 is formed when each memory cell in a given NAND string 112 is in a conductive state.

In the illustrated portion of the array, a first drain selection line (DSL) 140 drives the gate of a first drain selection transistor 141. The drain terminal of the first drain selection transistor 141, is connected to the corresponding bit line (BL) node 120.

A first source selection line (SSL) 150 drives the gate of a first source selection transistor 151. The source terminal of the first source selection transistor 151 is connected to the common source node 130.

A second drain selection line 145 drives the gate of a second drain selection transistor 146. The second drain selection transistor 146 has a substantially equivalent structure to that of a memory cell. Accordingly, the second drain selection line 145 is further identified as being "transistor equivalent" (DSLTE). It is noted that the gate of the second drain selection transistor 146 may be biased to a desired voltage in a controlled way. The drain terminal of the second drain selection transistor 146 is connected to the source terminal of the first drain selection transistor 141.

A second source selection line 155 is also present for driving the gate of a second source selection transistor 156. The second source selection transistor 156 is substantially structurally equivalent to that of a memory cell. Accordingly, the second source selection line 155 is further identified as being "transistor equivalent" (SSLTE). It is noted that the gate of the second source selection transistor 146 may be biased to a desired voltage in a controlled way. The source terminal of the second source selection transistor 156 is connected to the drain terminal of corresponding first source selection transistor 151.

The configuration described above minimizes programming disturbances that pose severe limitations to the scaling and miniaturization of typical electronic NAND memory devices. One of such programming disturbances may be observed in modern NAND devices featuring a distance between the source selection line 150 and the closest memory cell 111(0) in a NAND string that is below about 100 nm. During a programming operation, memory cells that do not need to be programmed are biased to a program inhibit voltage that, in combination with a self-boosting mechanism, raises the voltage of inverted channel regions so that electric charge flow through the tunnel oxide does not occur and the charge state of the floating gate memory transistor is not altered. However, during the programming operation the channel region of the source select line transistor 151 is depleted; under these conditions electron-hole pairs are generated. A high electric field in the silicon substrate is present between the source selection line transistor 151 and the channel region of the closest memory cell 111(0). The generated electric charge is subject to such an electric field and may be accelerated toward the memory cell region gaining energy. A portion of these energetic charges may be injected into the floating gate of the memory cell modifying its charge state in an undesired fashion. A similar effect is observed for the memory cell 111(N−1) closest to the drain selection line 140 at the drain side of the NAND string. The configuration according to one embodiment effectively decouples the first source selection transistor 151 from the closest memory cell 111(0) and/or the first drain selection transistor 141 from respectively closes memory cell 111(N−1), therefore avoiding any program disturbance.

In one embodiment, only the second source selection line 155 and corresponding second source selection transistor 156 are present while the second drain selection line 145 and second drain selection transistor 146 are not present.

A plurality of rows or word lines (WL) 110 drive the control gates of non-volatile memory cells 111. Each memory cell 111 is located at the crossing of respective row and column, so for example row 110(x) and column 120(y) are selected to address cell 111(x, y), as depicted in FIG. 1b, where three bit lines (BL) 120(y−1), 120(y) and 120(y+1) of the array are represented.

Within the NAND string 112, non-volatile memory cells 111 are serially connected with each other between the second drain selection transistor 146 and the second source selection transistor 156. The number N of memory cells 111 in the NAND string depends on the product design and in one embodiment it is 16 and in another embodiment it is 64. Typically the number N of cells is a power of two.

The second drain selection transistor 146 produces an efficient electrical decoupling between the first drain selection transistor 141 and the non-volatile memory cell 111 on the last word line 110(N−1).

In a similar fashion, the second source selection transistor 156 produces an efficient electrical decoupling between the first source selection transistor 151 and the non-volatile memory cell 111 on the first word line 110(0).

In one embodiment, the second source selection transistor 156 and/or the second drain selection transistor 146 have a threshold voltage whose value is defined by processing conditions, such as the gate oxide thickness and the channel doping concentration. This has the advantage that operating conditions are repeatable, as opposed to other approaches featuring a floating gate decoupling transistor, whose threshold voltage cannot be fully controlled as it is directly affected by the amount of charge stored in the floating gate.

As it will become clear from the description below, the second drain selection line 145 (DSLTE) and the second source selection line 155 (SSLTE) are realized with the same physical dimension of the word lines 110 and therefore also provide a continuation of the region accommodating the non-volatile memory cells 111. Therefore, providing the further advantage that the irregularity associated with the different line width of the first drain selection line 140 (DSL) and the first source selection line 150 (SSL) is therefore completely eliminated, and a much better dimensional uniformity can be obtained in realizing the word lines 110 and memory cells 111.

Exemplary Operation of a NAND String

Exemplary operating conditions of a NAND string according to an embodiment of the invention are reported in Table I and are now described in detail for each of the read, the program, and the erase operations.

TABLE I read, program and erase conditions

| | READ | PROGRAM | ERASE |
|---|---|---|---|
| Addressed bit line | Va | GND/Vcc | FLOAT |
| Unaddressed bit line | GND | Vcc | FLOAT |
| Addressed word line | Vread | Vprog | GND |
| Unaddressed word line | Vpass | Vpass | FLOAT (≠block) |
| DSL | Vpass | Vcc | FLOAT |
| DSLTE | Vpass | Vcc | FLOAT |
| SSL | Vpass | GND | FLOAT |
| SSLTE | Vpass | $V_{TE}$ | FLOAT |
| Source common node | GND | Vs | FLOAT |
| P-well common node | GND | GND | Verase |

During the read operation, the addressed bit line is pre-charged to an evaluation voltage (Va). According to an embodiment, Va is in the range of 0 to 3V, for example 1V. The unaddressed bit lines are biased to a reference potential. In an embodiment, the reference potential is the device ground voltage GND. The addressed word line is biased at a reading voltage Vread which may be in the range of 0 to 5V, for example in an embodiment it is 0V. The unaddressed word lines are biased to a voltage Vpass sufficiently high to guarantee that the corresponding memory cells are in a conductive state independently of their logic state. Vpass is higher than the maximum threshold voltage of any memory cell. Therefore, Vpass may be in the range 4 to 8V and in an embodiment it is 5V. In a similar fashion, the selection transistors in series with the addressed cell should be in a conductive state, so DSL, DSLTE, SSL and SSLTE are all biased to a sufficiently high voltage to turn them on. Such a voltage may be the same Vpass voltage or other voltage such as Vcc. The source common node and the P-well common node are kept at a reference voltage, such as the ground (GND) voltage.

After the addressed bit line has been pre-charged, it is isolated from the sensing circuitry and its potential is left to progress according to the conductivity of the NAND string. As the other elements in series with the addressed cell are in a conductive state, a conduction path from the pre-charged bit line to the source common node at GND potential is present only if the threshold voltage of the addressed cell is lower than the read voltage (Vread) applied to the corresponding word line. In such an event, the addressed bit line discharges in time. On the contrary, if the addressed cell's threshold voltage is higher than the Vread voltage, a conduction path is not formed and the addressed bit line will remain charged (except for the unavoidable discharge rate due to the reverse biased junctions). After a predetermined duration of time, the bit line is connected to the sensing circuitry (not shown) to detect its charge state and a logic value is attributed to the data contained in the addressed memory cell.

In an embodiment, each memory cell contains binary information (0/1) respectively corresponding to two possible states of charge stored in the floating gate. In another embodiment, each memory cell contains more than two allowed levels of charge and correspondingly more than a single bit of information is stored in each memory cell.

The read operation may also be carried out in different ways, such as evaluating the bit line voltage at different delays in time or repeating the reading with different values of the read voltage Vread. The latter applies to an embodiment featuring multilevel data storage in the memory cells.

In one embodiment, the reading operation is performed by first pre-charging the addressed bit line to 1V while biasing the unaddressed bit lines to GND voltage. The addressed word line is then biased to 0V, while unaddressed word lines in the addressed string are biased to 5V. All selection transistors are also brought to a conductive state by biasing the corresponding DSL, DSLTE, SSL and SSLTE to 5V while keeping the source common node and the P-well common node to the GND potential. The bit line is insulated from the sensing circuitry and its potential is left to progress for a pre-fixed duration of time according to the threshold voltage of the addressed cell in the addressed NAND string. The bit line is then connected to the sensing circuitry and a logic state is assigned to the memory cell according to the result of the evaluation of the bit line voltage.

During the program operation, the addressed bit line is biased to a reference ground voltage GND, if the memory cell should be programmed, or biased to a program inhibit voltage if the memory cell should not be programmed, i.e. it should be left in the erased state. In an embodiment, a sequence of programming steps are applied and the addressed bit line is biased to a reference voltage GND when the memory cell needs further programming, while it is biased to the inhibit voltage when the programming should not continue because it was already completed in a previous step. Typically, the program inhibit voltage is the power supply voltage (Vcc), that normally in the range 1.8 to 3.3V; in an embodiment Vcc is 3V. The unaddressed bit lines are biased to the program inhibit voltage, to avoid programming. The addressed word line is biased to a programming voltage (Vprog), to generate a sufficiently high electric field to cause charge tunneling into the floating gate for those memory cells whose bit line is grounded. Typically Vprog is in the range 10 to 22V and in one embodiment it increases at each programming step from a starting voltage of 12V in steps of 1V. Memory cells whose bit line is biased to the program inhibit voltage will be subjected to a lower electric field that is insufficient to produce charge injection into the floating gate and correspondingly the memory cells are not programmed. In an embodiment, the lower electric field is also obtained as a consequence of a self-boosting mechanism producing a channel potential increase in correspondence to the addressed and unaddressed word line voltage. Unaddressed word lines are biased to a transfer voltage (Vpass) that is higher than the maximum threshold voltage of any of the memory cells. Vpass is typically in the range 5 to 12V and in an embodiment it is 8.5V. Such a biasing condition puts the cells in series with the addressed cell are in a conductive state and therefore efficiently transfer the addressed bit line voltage when it is GND. In a similar fashion, the first 141 and the second 146 drain selection transistors are biased above their threshold voltage value so as to be in a conductive state. Typically, DSL and DSLTE are biased at the supply voltage (Vcc). In an embodiment, the second drain selection transistor line DSLTE 145 is biased at a higher voltage than the first drain selection transistor line DSL 140 in order to effectively decouple the first drain selection transistor 141 and the memory cells 111(N−1) on the nearest word line 110(N−1). This biasing effectively reduces the probability that charges generated in the depleted region under the first drain selection transistor 141 would be injected into the floating gate of the adjacent memory cell and therefore the adjacent memory cell remains undisturbed. In a different embodiment, a Vpass voltage lower than the maximum allowed threshold voltage of the memory cells is used at least on a sub-set of the unaddressed word lines, i.e. in the range of 0 to 6V, to interrupt string continuity and to improve boosting ascribed to addressed word line biasing.

The first source selection transistor 151 is kept in a non-conducting state to electrically insulate the NAND string from the source common node and therefore avoid active consumption of current. In an embodiment, the first source selection transistor 151 is kept at the ground reference potential GND. The second source selection transistor 156 is biased to a conductive state to effectively decouple the first source selection transistor 151 on first source selection line 150 and the memory cells 111(0) on the nearest word line 110(0). This biasing effectively reduces the probability that charges generated in the depleted region under the first source selection transistor 151 would be injected into the floating gate of the adjacent memory cell and therefore the adjacent memory cell remains undisturbed.

Moreover, the second source selection line 155 and the second drain selection line 145 produce a shielding effect that is not affected by uncontrolled threshold voltage variation intrinsically present in the case where selection lines include dummy cells with floating gate transistors.

Typically SSLTE 155 is biased to a voltage VTE that corresponds to the power supply voltage (Vcc). In another embodiment, SSLTE 155 is biased to a voltage VTE that corresponds to the internal supply reference voltage (Vss). Vss is typically in the range 0 to 3V and in an embodiment Vss is 1.8V. The common source node is biased to a source voltage (Vs) in the range 0 to Vcc and in one embodiment Vs is the ground reference voltage GND. In another embodiment, Vs is the power supply voltage Vcc. The common P-well node is biased to the ground reference voltage GND.

With the programming biasing conditions described above, a high electric field is applied to the addressed memory cell to be programmed. The control gate of the floating gate transistor is at the high programming voltage Vprog while the channel of the floating gate transistor is kept at the ground voltage GND, this voltage is provided from the addressed bit line and is effectively transferred to the addressed memory cell. Memory cells that are not to be programmed, either because they are unaddressed or because the stored information does not need to be changed, have the channel of the floating gate transistor pre-charged to a program inhibit voltage substantially equal to Vcc diminished by the threshold voltage of the first drain selection transistor. When the programming voltage Vprog is applied to the addressed word line, the effective voltage of the channel of these memory cells is further increased due to capacitive coupling and therefore the total electric field is not sufficient to alter the stored charge significantly.

In an embodiment, the programming operation begins by first biasing the addressed bit line to GND, if the memory has to be programmed, or to 3V, if it has to be left alone and unaddressed bit lines are biased to 3V. The addressed word line then is biased to a starting voltage of 12V, while unaddressed word lines are biased to 8.5V. During the programming operation DSL and DSLTE are biased to 3V while SSL is at GND potential and SSLTE is biased to 3V. The source common node and the P-well common node are kept at GND potential.

In an embodiment, the full programming operation comprises a sequence of programming steps as described above until a predefined target programming condition is verified. Each of the programming steps may differ from the previous one in amplitude of the programming voltage Vprog—that is typically increased from one step to the next one for example by 1V, and/or in duration. In an embodiment, a plurality of target programming conditions are predefined, so that a plurality of charge states may be obtained, each of the charge states corresponding to a logic state typically representing more than a single bit.

During the erase operation all nodes are left floating except for the addressed word lines which are biased at the reference ground voltage GND, and the common P-well node which is biased to the erase voltage (Verase). Verase is typically in the range +16 to +22V and in an embodiment Verase is +19V.

It is noted that in the erase operation typically all the word lines within an addressed block, i.e. all the word lines related to the same NAND string, are erased at the same time. Correspondingly all these word lines are biased to the same GND voltage as indicated in Table I in the addressed word line row. Unaddressed word lines, left to a floating potential, are those word lines related to different blocks in the array.

With the above described biasing conditions, the memory cells in the addressed block are subjected to a high electric field between the grounded word line and the common P-well voltage Verase. As a result, charge is removed from the floating gates and the addressed memory cells are erased. All other memory cells, i.e. those in not addressed blocks, have a floating word line whose effective voltage increases by capacitive coupling, so that no effective electric field is present and the charge stored in the floating gate is unaffected.

In an embodiment, an erase operation is carried out by biasing the addressed word lines (in the addressed block) to GND voltage while floating all other nodes (unaddressed word lines, belonging to unaddressed blocks, and bit lines) and biasing the P-well common node to +19V.

In an embodiment, the erasing phase includes a sequence of erasing steps as described above. Typically the erasing steps are repeated until a predefined target erasing condition is verified. Each of the erasing steps may differ from the previous one in amplitude of the erasing voltage Verase—that is typically increased from one step to the next one for example by 1V—and/or in duration.

Figure 8:
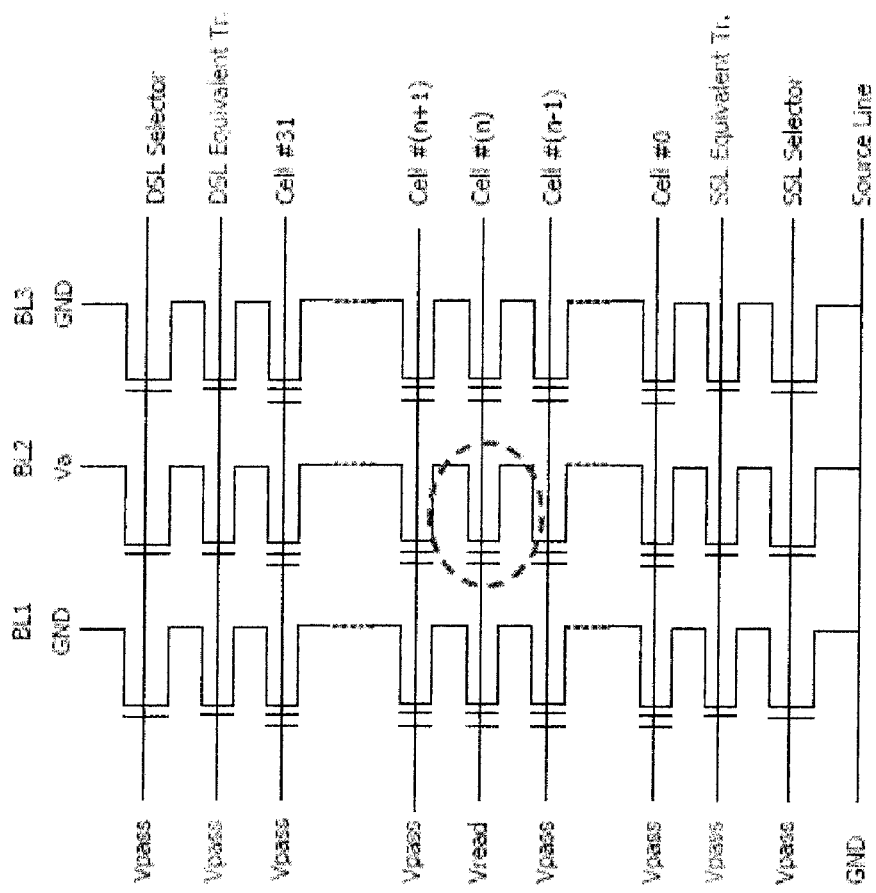
FIGS. 8-10 graphically illustrate exemplary read, program, and erase operations of a NAND string in an array.
Figure 9:
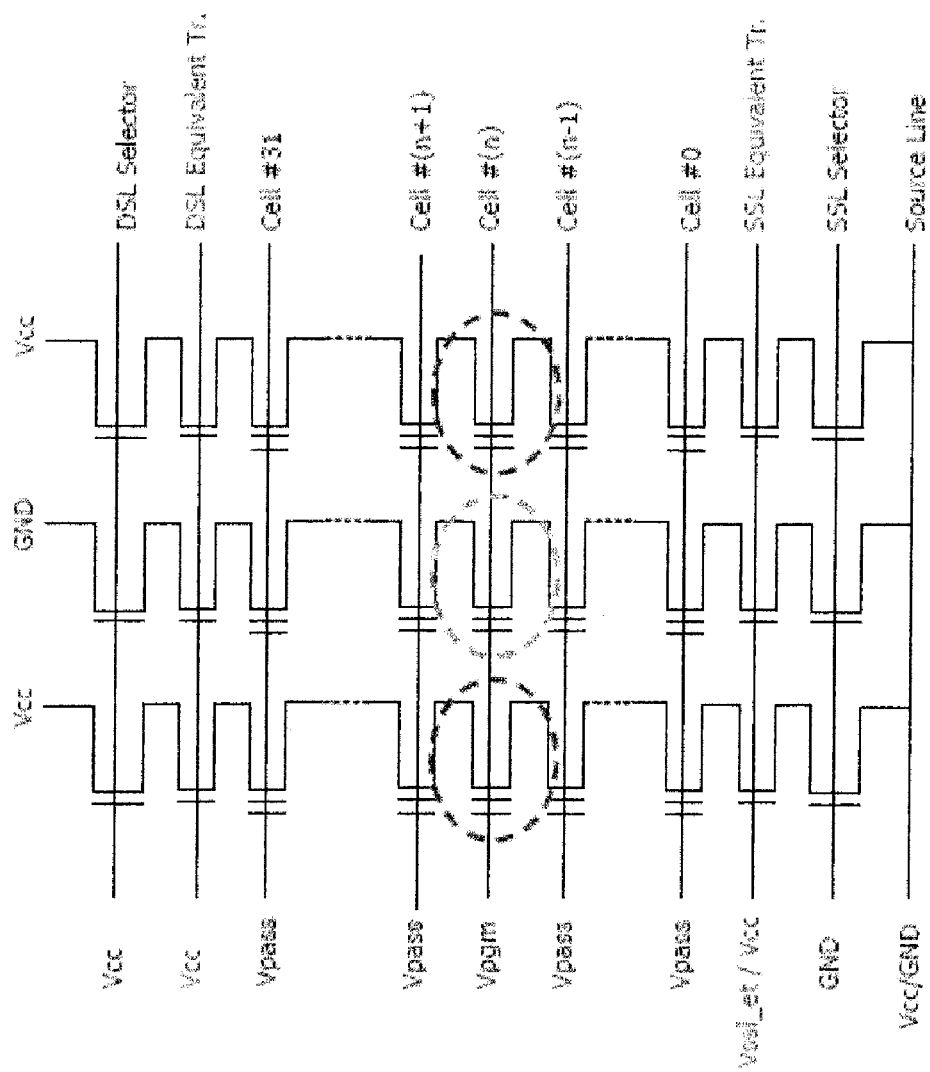
Figure 10:
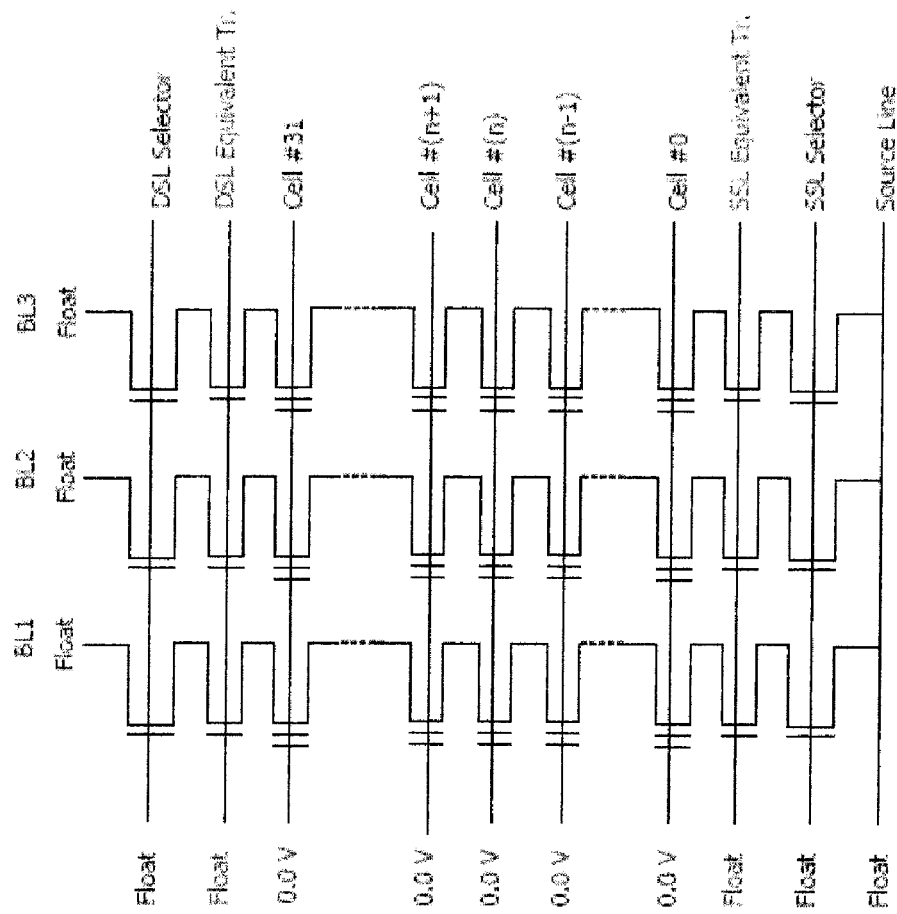

After the erase operation, a soft-programming operation may be performed to obtain a more compact threshold voltage distribution. Soft-programming conditions may be similar to those during the program operation, but with reduced voltage amplitudes in order not to completely program the memory cells. In an embodiment, a sequence of soft-programming steps is applied until a soft-program verification condition is satisfied. FIGS. 8-10 graphically illustrate exemplary read, program, and erase operations of a NAND string in an array.

Exemplary NAND String Structure

Figure 2A:
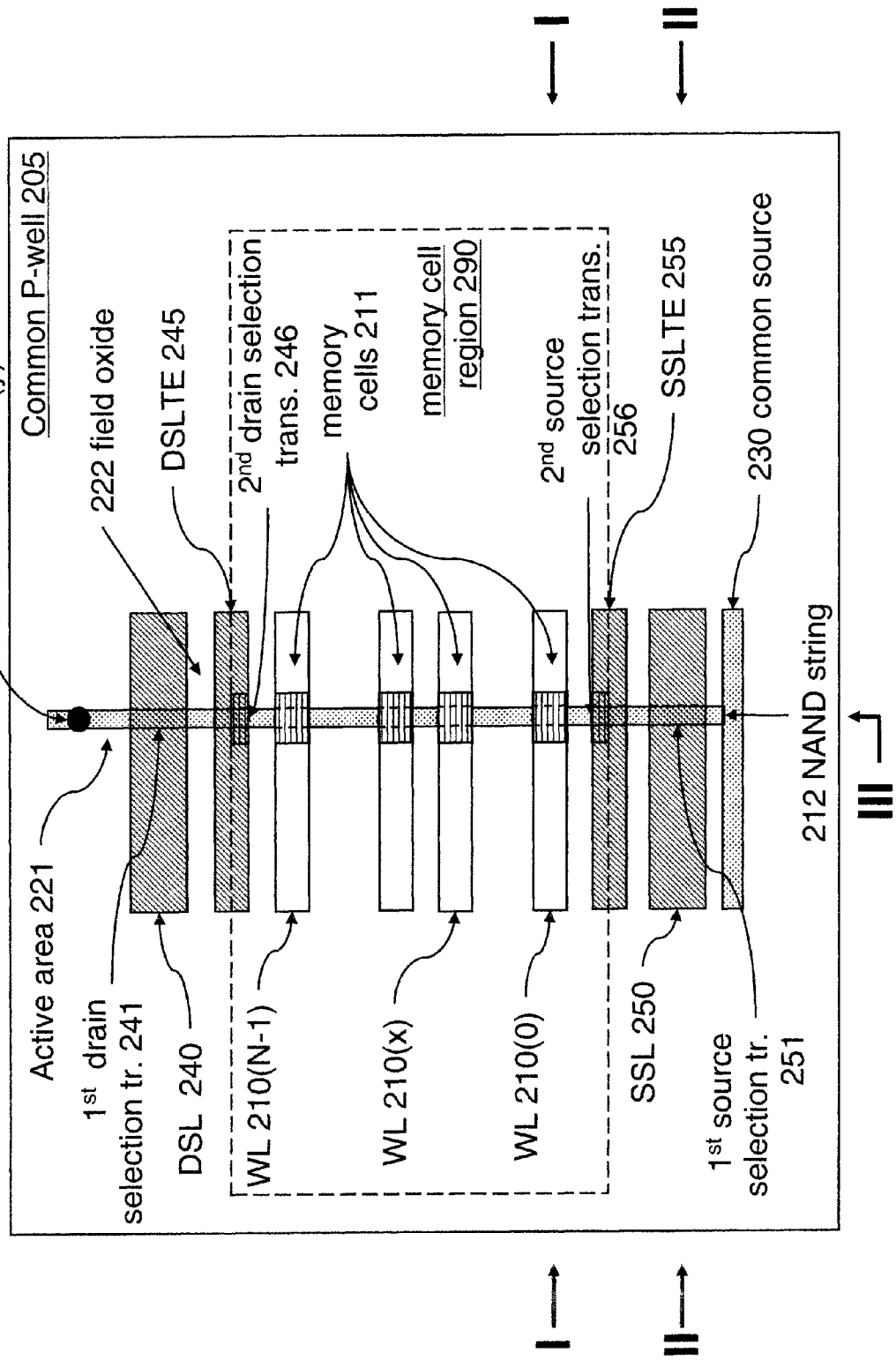
Figure 2B:
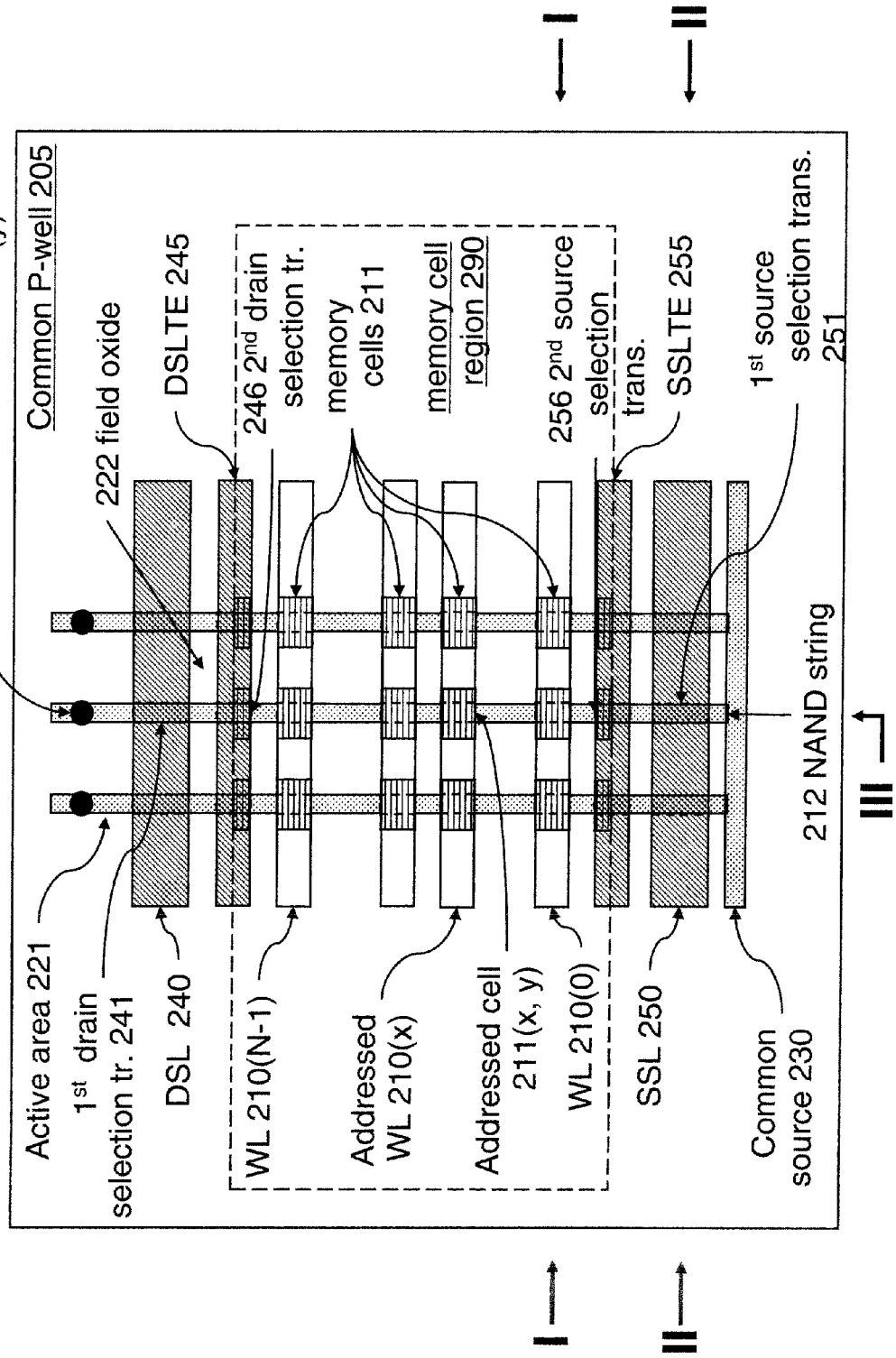
FIG. 2b illustrates a partial top view of a portion of the memory array of FIG. 1b.

FIG. 2a illustrates a partial top view of a portion of the memory array of FIG. 1a. As illustrated, the memory array includes a common well 205 with P-type doping. The common P-well is embedded into a N-type well (not shown in FIG. 2a so as to simplify the drawing) to insulate the common P-well 205 from the chip substrate (also not shown). Throughout the specification and claims, when substrate is used it referes to the common P-well unless otherwise noted. Within the common P-well 205 are active area regions 221 to accommodate the NAND strings 212. In FIG. 2a only one NAND string 212 is represented, while FIG. 2b depicts three NAND strings 212 with corresponding active regions 221, however, usually there are more than three NAND strings in a memory array. The same numerals are used in FIGS. 2a and 2b for corresponding items and the following description applies to either of the two figures, unless differently specified.

The active area regions 221 are separated and insulated from each other by field oxide regions 222. Active area regions 221 are coupled to respective bit lines' metallic interconnections (not shown in FIG. 2) through respective contacts 220. Active area regions 221 are also coupled to common source active area 230.

A plurality of word lines 210 is also provided. The word lines 210 extend perpendicular to the active area regions 221 and bit lines. At the crossing of word lines 210 and bit lines non-volatile memory cells 211 are formed on active area regions 221.

Each memory cell 211 includes a floating gate transistor whose structure will be subsequently described with reference to FIGS. 3 and 5. Typically the number of word lines, 210(0) to 210(N−1), is a power of two, such as 16, 32 or 64. Correspondingly a plurality of N serially connected floating gate transistors (memory cells) 211 are in each NAND string 212.

First drain selection line 240 forms, in each NAND string, first drain selection transistors 241 at the crossing of the first drain selection line 240 with each of the active area regions 221, respectively.

According to an embodiment, second drain selection line 245 forms in each NAND string 212, second drain selection transistors 246 at the crossing of the second drain selection line 245 with each of the active area regions 221, respectively.

First source selection line 250 forms, in each NAND 212, string first source selection transistors 251 at the crossing of the first source selection line 250 with each of the active area regions 221, respectively.

According to an embodiment, second source selection line 255 forms, in each NAND 212, string second source selection transistors 256 at the crossing of the second drain selection line 255 with each of the active area regions 221, respectively.

The structure of the first 241 and second 246 drain selection transistors and of the first 251 and second 256 source selection transistors will be described in more detail below, with reference to FIGS. 3, 4, and 5. As will be evident from the description below, in one embodiment a patterning step differentiating a memory cell region 290 from an outer region, impacts the structure of the second drain selection transistors 241 and of the second source selection transistors 251.

Figure 3:
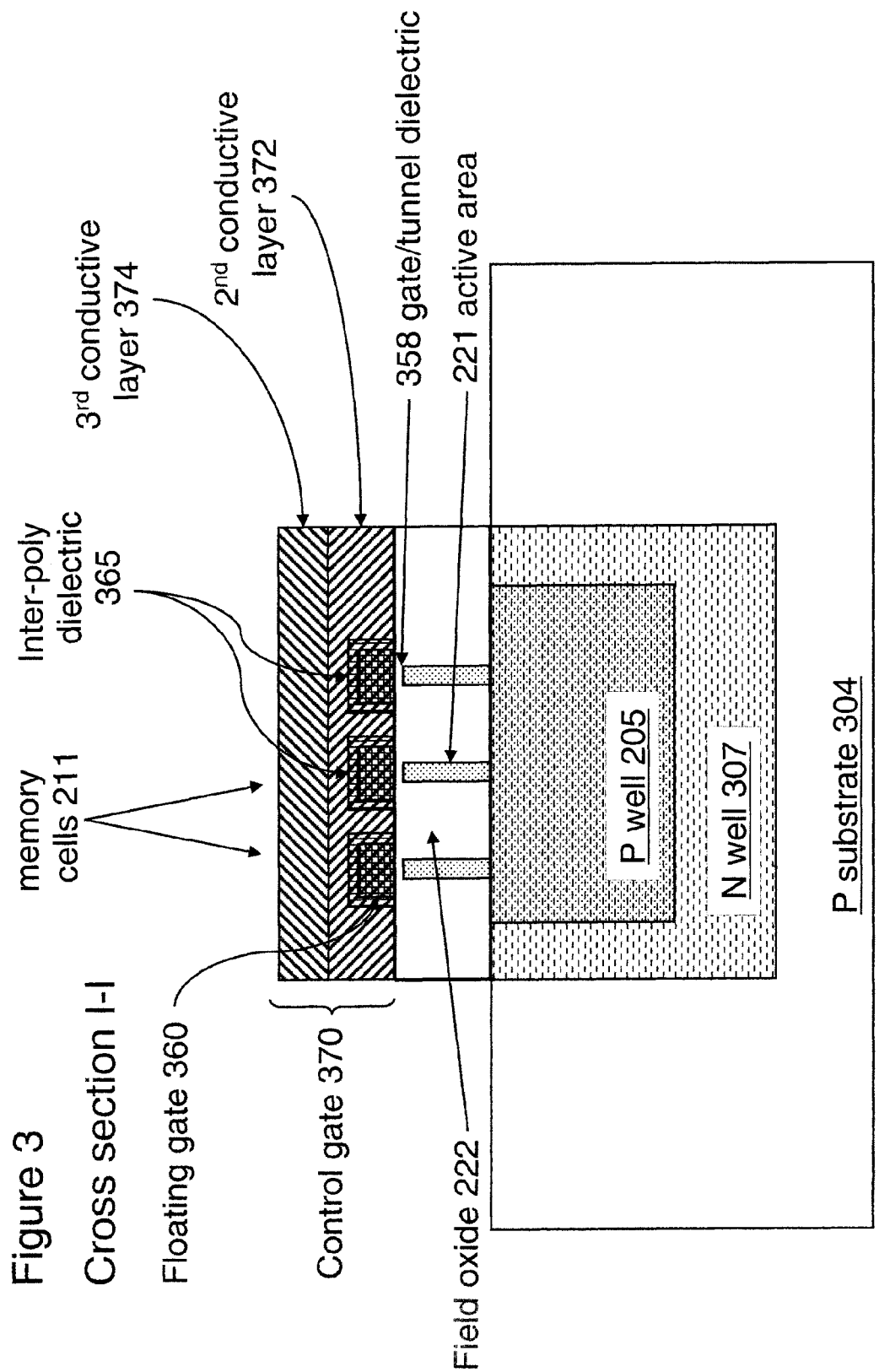
FIG. 3 illustrates a cross section along line I-I in FIG. 2.

FIG. 3 illustrates a cross section along cut line I-I of FIG. 2, i.e. along a word line 210. It is noted that FIG. 3 also depicts the second drain selection line 245 and the second source selection line 255 for a cross section taken inside the memory cell region 290. The same numerals of FIG. 2 have been maintained to identify the corresponding items in FIG. 3.

A N-type well 307 is formed in the silicon substrate 304 and within the N-type well 307 a P-type common well 205 is embedded to accommodate the memory array.

Active area regions 221 contact the P-type common well 205 and are separated and electrically insulated from each other by field oxide regions 222.

Each non-volatile memory cell 211 includes a floating gate transistor with a floating gate 360. The floating gate 360 is a first conductive material, typically polycrystalline silicon or polysilicon. In an embodiment, N-type doped polysilicon is used.

The floating gate 360 is separated from the underlying channel region by a gate/tunnel dielectric layer 358. In one embodiment, the gate/tunnel dielectric layer 358 is obtained by thermal oxidation of silicon, but other formation processes and/or materials may be suited for this purpose, i.e. deposition and/or high dielectric constant materials. The thickness of the gate/tunnel dielectric layer 358 is sufficiently thin to allow electric charge flow from/to the floating gate 360 during the programming and the erasing operations. At the same time, the gate/tunnel dielectric 358 is sufficiently thick to retain charge. Typically the thickness of the gate dielectric layer is in the range 5 to 13 nm and in an embodiment it is 9 nm.

The floating gate 360 is separated from the overlapping control gate 370 terminal by an interpoly dielectric layer 365. The interpoly dielectric may be more than a single layer. In an embodiment, it is a three layer structure of silicon oxide, nitride, and oxide with physical thicknesses that are in the ranges 4 to 9 nm, 5 to 15 nm, and 2 to 7 nm, respectively.

The control gate 370 consists of at least a second conductive layer 372 such as doped polysilicon. In an embodiment, the control gate 370 further includes a third conductive layer 374. The two conductive layers 372 and 374 are in direct contact with each other and form a single terminal from an electrical point of view. In an embodiment, the third conductive layer 374 is a metallic material.

Figure 4:
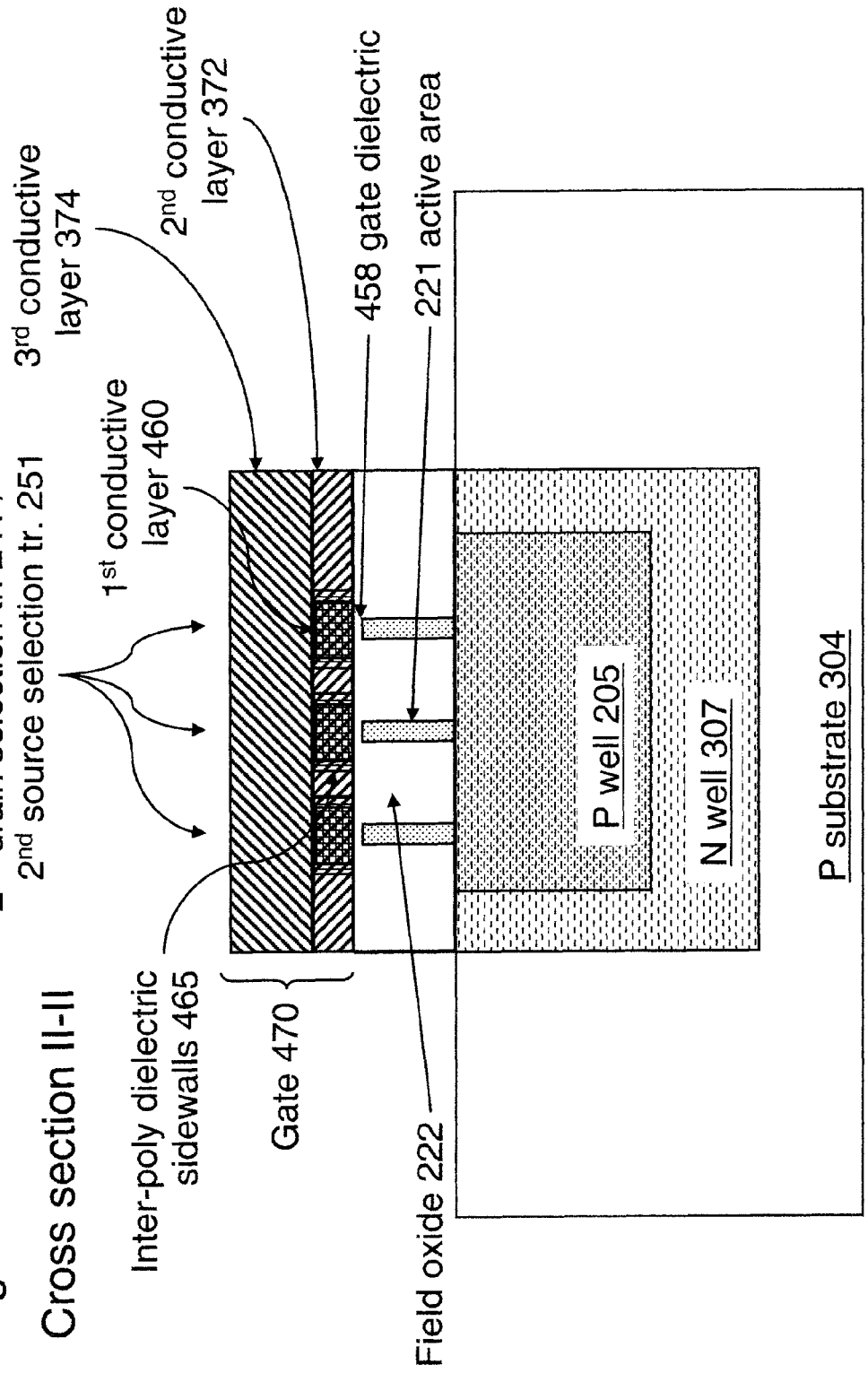
FIG. 4 illustrates a cross section along line II-II in FIG. 2.

FIG. 4 illustrates a cross section along cut line II-II of FIG. 2, i.e. along a source selection line 250. It is noted that FIG. 4 also depicts the cross section along a drain selection line 240. Moreover, it also depicts the second drain selection line 245 and of the second source selection line 255 for a cross section taken outside the memory cell region 290.

In FIG. 4 the same numerals of FIGS. 2 and 3 have been maintained to identify the corresponding items.

A N-type well 307 is formed in the silicon substrate 304 and within the N-type well 307 a P-type common well 205 is embedded to accommodate the memory array.

Active area regions 221 contact the P-type common well 205 and are separated and electrically insulated from each other by field oxide regions 222.

Each source selection transistor 251 or drain selection transistor 241 includes a gate 470 electrode which is separated from the underlying channel region by a gate dielectric layer 458. In an embodiment, the gate dielectric layer 458 is formed at the same time as the gate/tunnel dielectric layer 358 described with reference to FIG. 3.

The gate 470 consists of at least the second conductive material 372. Typically doped polysilicon is used.

In an embodiment, the gate 470 further includes a third conductive layer 374.

The gate 470 also consists of portions of a first conductive layer 460 that have interpoly dielectric layer 465 at respective sidewalls. The portions of first conductive layer 460 have respective top surfaces in direct contact with third conductive layer 374.

The conductive layers are in contact with each other and form a single terminal from an electrical point of view. In an embodiment, the third conductive layer 374 is a metallic material. In another embodiment, a hard mask layer, not shown in FIG. 4, is present on the top surface of the third conductive layer 374.

FIG. 5 illustrates a cross section along cut line III-III of FIG. 2, i.e. along a NAND string 212. The cross section is in the bit line direction So that active area regions 221 are shown.

In FIG. 5 the same numerals of FIGS. 2, 3 and 4 have been maintained to identify the corresponding items.

The common P-well 205 accommodates the NAND strings 212 in memory array.

Memory cells 211 are serially disposed in the NAND string 212. Each memory cell 211 includes a floating gate 360 separated from the channel region formed in the active area by gate/tunnel dielectric 358. The floating gate 360 is also separated from a control gate electrode 370 by an interpoly dielectric layer 365. Each control gate 370 is part of the corresponding word line 210 running in the direction perpendicular to the cross section of FIG. 5. The control gate 370 consists of at least the two conductive layers 372 and 374 that are in contact with each other and form a single terminal from an electrical point of view.

The NAND string 212 also includes a first source selection transistor 251 and a second source selection transistor 256 in series with the memory cells 211. The first 251 and second 256 source selection transistors are respectively part of first source selection line 250 (SSL) and second source selection line "transistor equivalent" 255 (SSLTE).

The gate of first source selection transistor 251 has the first conducting layer 460 in contact with the third conducting layer 374 to form a single electrical terminal separated from the active area by gate dielectric 358.

The gate of second source selection transistor 256 has the first conductive layer 460 in contact with third conductive layer 374 only on a portion of the gate length. On another portion the layers 460 and 374 are physically separated by interpoly dielectric layer 365 and second conductive layer 372. In any case, all the conductive layers form a single gate terminal separated from the active area by gate dielectric 358.

The NAND string 212 is connected to a common source active area 230.

The NAND string has at the drain side, a first drain selection transistor 241 and a second drain selection transistor 246 in series with the memory cells 211. The first 241 and second 246 drain selection transistors are respectively part of first drain selection line 240 (DSL) and second drain selection line "transistor equivalent" 245 (DSLTE). The structure of the first 241 and second 246 drain selection transistors is essentially the same as the structure of the first 251 and second 256 source selection transistors, respectively.

At the drain side the NAND string 212 is connected through a bit line contact 220 to the metallic interconnection bit line 520.

The structures illustrated in FIGS. 3, 4 and 5 are completed in a conventional way by other layers not shown in the figures. Other structures may be formed, such as source and drain regions, i.e. by ion implantation, an intermediate dielectric layer separating the third conductive layer 374 from first metallic interconnection layer 520. Other metallic interconnection layers and respective intermetal dielectric layers may be present with metal layer to metal layer contacts and a final passivation.

A Method of Manufacturing a NAND String

The process to manufacture the structures described above is now described with reference to FIGS. 6a-6e, which depict a cross section along cut-line III-III in FIG. 2.

Figure 6A:
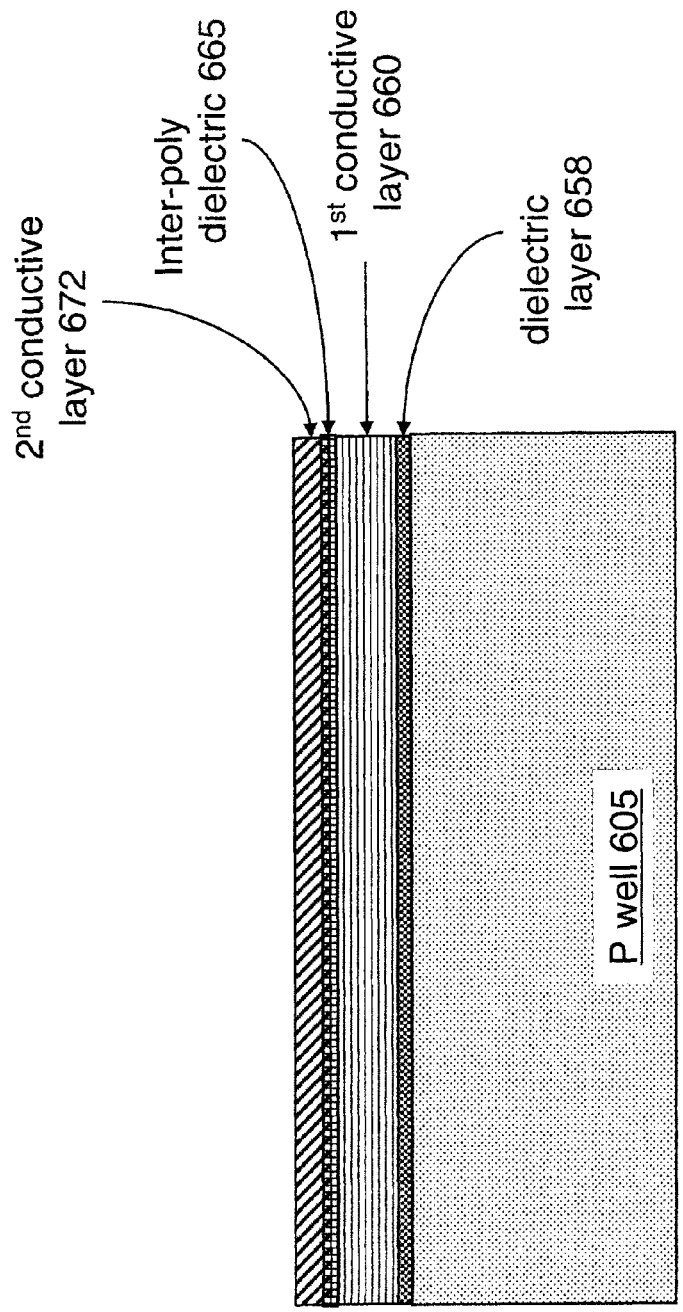
FIGS. 6a to 6e illustrate the bit-line cross section in a simplified process flow to manufacture a memory device according to one embodiment of the invention.

FIG. 6a illustrates the cross section at a stage in the process where a dielectric layer 658 is been formed on the common P-well 605, for example by thermal oxidation. This dielectric layer 658 serves as a gate/tunnel oxide for selection transistors and memory cells. A first conductive layer 660 is formed on the dielectric layer and may be doped polysilicon. An interpoly dielectric layer 665 is been formed on the first conductive layer 660. In an embodiment, the interpoly dielectric layer 665 includes a triple oxide-nitride-oxide layer. In an embodiment, the interpoly dielectric layer 665 is protected with a second conductive layer 672 of polysilicon.

The first conductive layer is un-patterned in this cross section, but may be patterned in other directions and/or in cross sections along a cut-line parallel to II-II, depending on the specific process flow preferred to reach this point. For example, a process architecture featuring an Advanced Self-Aligned Shallow Trench Isolation may be used, featuring a single masking step to define first polysilicon floating gates substantially aligned with active areas. Shallow Trench Isolation filling (not present in the cross section of FIG. 6) and etch back, i.e. by Chemical Mechanical Polishing (CMP), result in the cross section shown in FIG. 6a.

Alternatively separate masks may be used to define active areas and first conductive layer to form polysilicon floating gates that in this embodiment will typically extend onto field oxide regions.

Figure 6B:
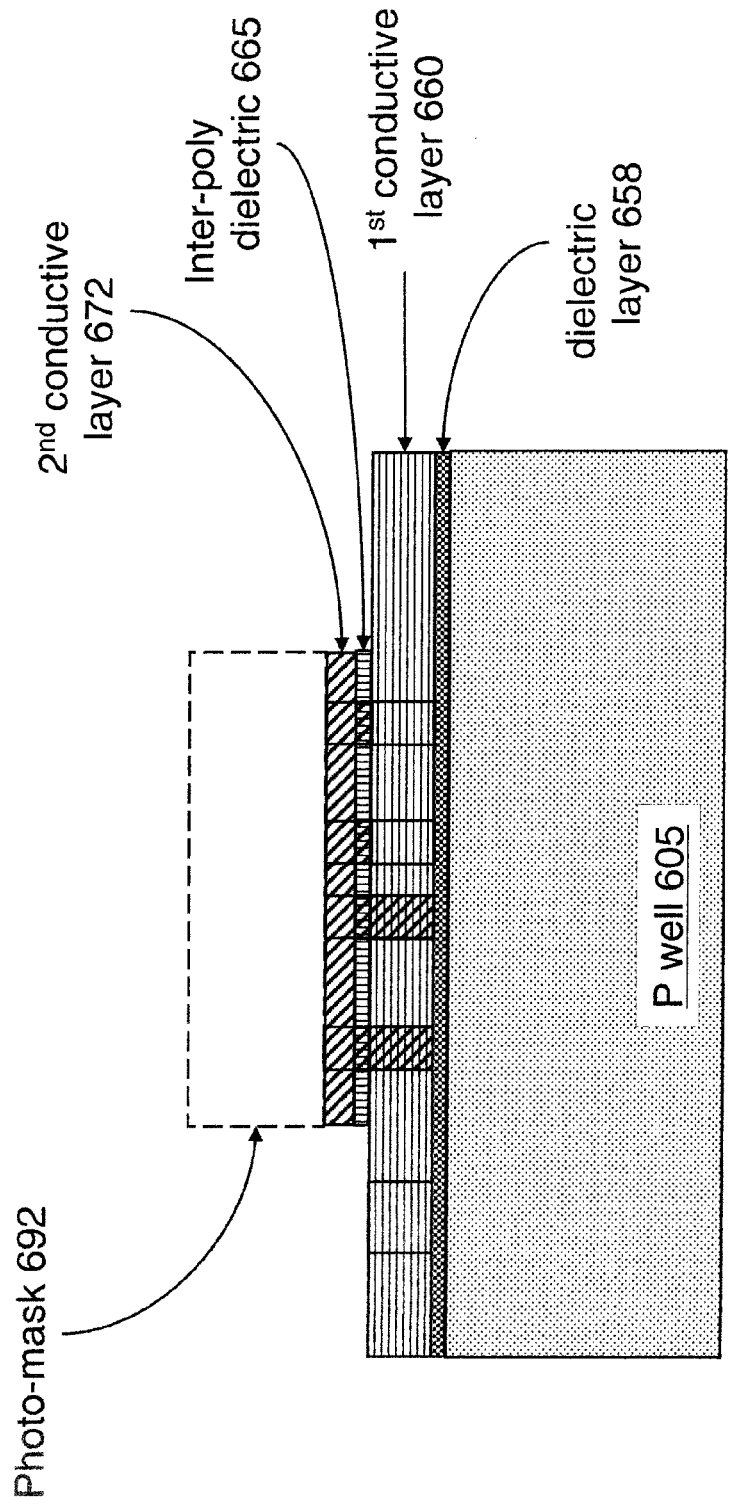

As shown in FIG. 6b, a photo-mask 692 and photo-resist are used to protect and selectively remove the second conductive layer 672 and the interpoly layer 665 with the rest of the second conductive layer 672 and interpoly layer 665 being etched. The photo-mask 692 protects a region corresponding to the memory cell region in FIG. 2. The second conductive layer 672 and the interpoly layer 665 removal may be carried out by Reactive Ion Etching (RIE) and/or wet etch in appropriate solution. The etch is stopped at the first conductive layer 660.

Figure 6C:
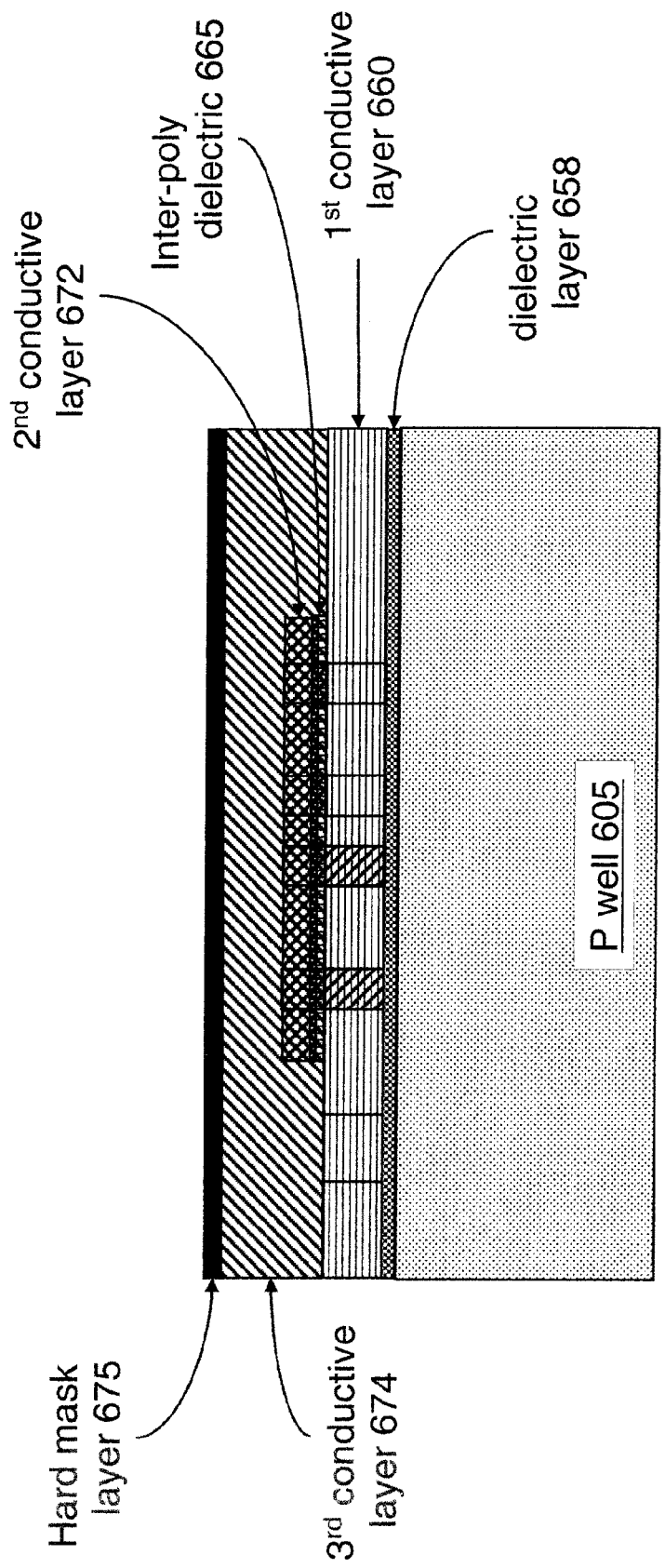

As shown in FIG. 6c, a third conductive layer 674, such as polysilicon, is formed on the first conductive layer 660 and second conductive layer 672 or interpoly layer 665. Where present, second conductive layer 672 is also in contact with third conductive layer 674.

In an embodiment, a hard-mask layer 675 is formed on top of third conductive layer 674. Such a hard-mask layer 675 may be silicon nitride, or any other material with good etching selectivity with respect to material used for layers 660, 672, and 674 and layers 658 and 665.

Figure 6D:
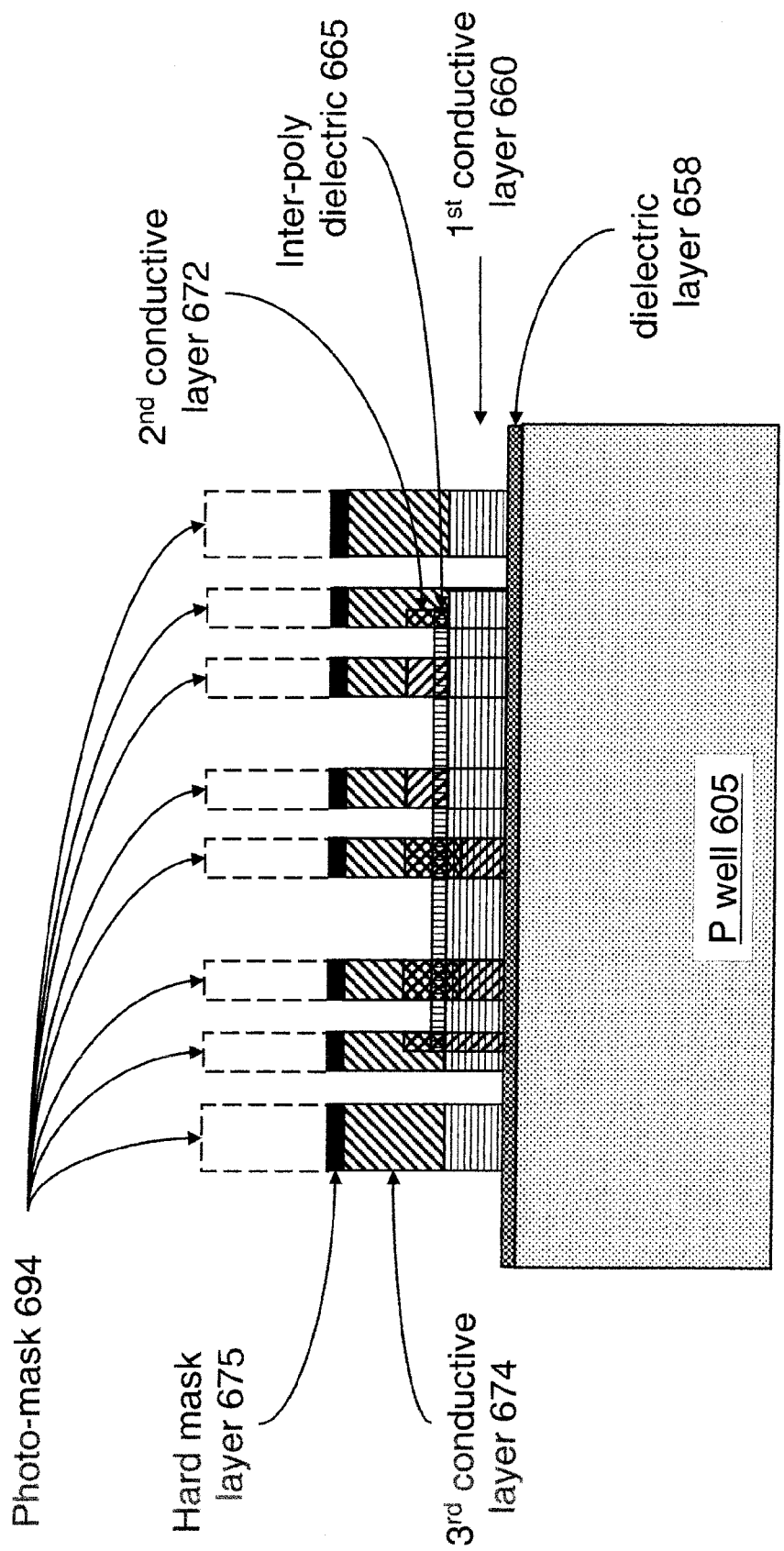

As shown in FIG. 6d a photo-mask pattern 694 is used surface to form drain and source selection lines and memory cells' control gates and word lines. During an etching step the conductive material is removed from the exposed regions. The etch may be of the RIE type to guarantee maximum anisotropy. The etch stops when the first dielectric layer is encountered as the etch rate is substantially different for the two kinds of materials. This respectively occurs at the gate/tunnel dielectric 658 in the regions between drain/source selection lines and at the interpoly dielectric 665 where memory cells are to be formed. Correspondingly the gates of the first drain selection transistor and of the first source selection transistor are defined. In the memory cells region only the control gates are defined, while the floating gates are not yet separated from each other in this direction. The gates of second drain selection transistor and second source selection transistor are defined only on drain and on source sides, respectively.

Figure 6E:
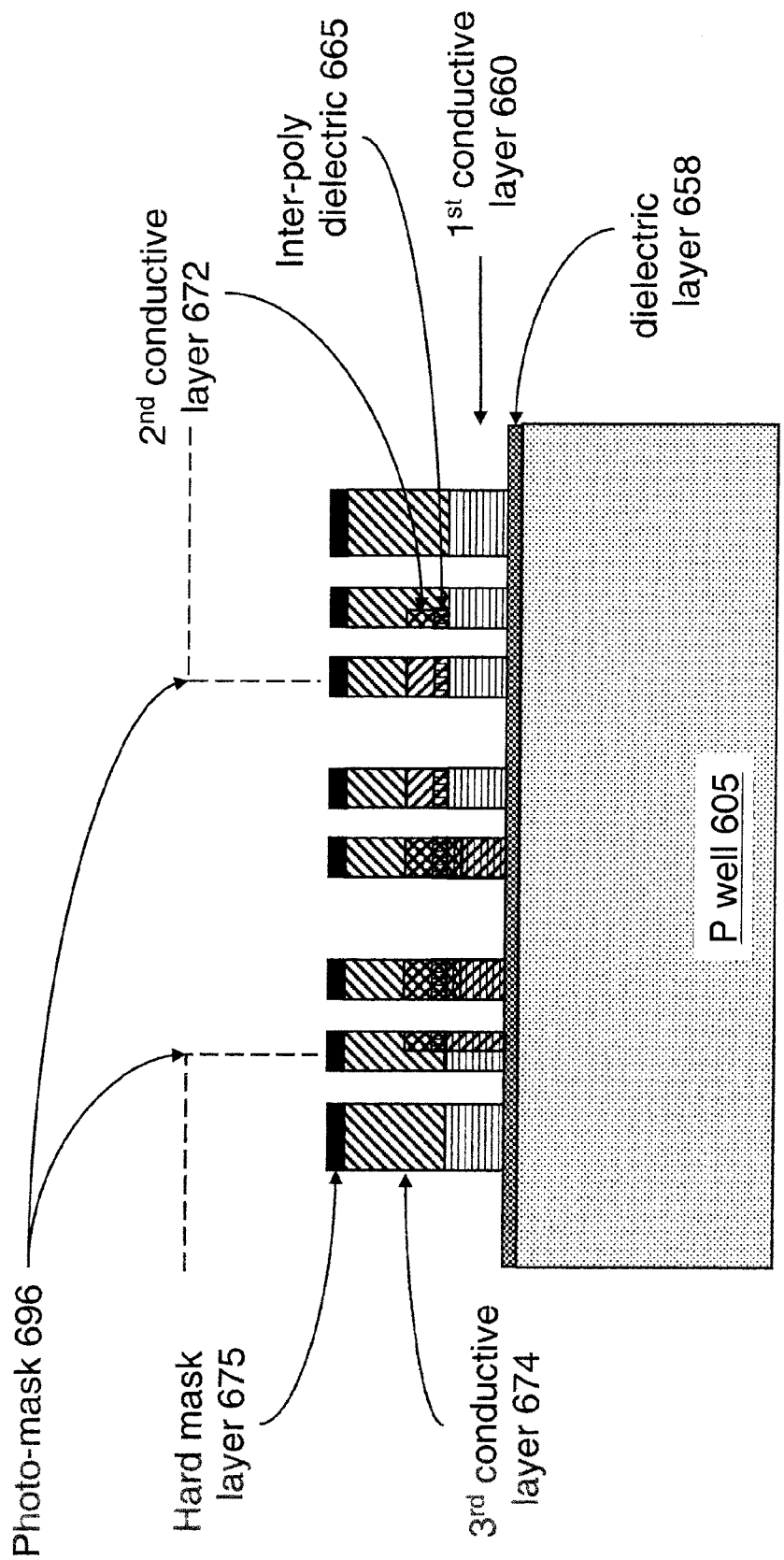

Definition of the word lines of the memory cells and of second drain and source selection transistors is completed as shown in FIG. 6e.

A photo-mask layer 696 is used to protect the gates of first drain and source selection transistors and partially overlap with gate of second drain and source selection transistors, while leaving unprotected the memory cell region 290. Another etching step is performed with a chemistry featuring high selectivity between the hard-mask layer 675 and the interpoly 665 and the first conductive layer 660. The etch is stopped when unprotected (either by the photo-mask 696 or by the hard-mask 675) conductive material is removed, i.e. when the gate/tunnel dielectric is reached.

The structure of FIG. 6e substantially corresponds to the structure described in FIG. 5.

The photo-mask 696 is then removed and the process continues with other steps, such as source and drain doping by implant, intermediate dielectric formation, contact opening, metal deposition and patterning, etc.

The string including the memory cells (elements) is serially connected to first and second source selection transistors, the second source selection transistor having a portion of the gate electrode including a layer of interpoly dielectric. The string including the memory cells (elements) is also serially connected to first and second drain selection transistors, the second drain selection transistor having a portion of the gate electrode including a layer of interpoly dielectric.

First source and first drain selection transistors have a gate electrode of a double layer of first and third conductive layers in direct contact with each other for the whole gate length.

Some embodiments have been described above, however other different approaches may also be followed, i.e. in the formation of the floating gate/gate dielectric/active area.

Because of the presence of the second source selection line 255 and of the second drain selection line 245, whose structure closely reproduces the structure of a word line 210, all word lines 210 have a similar neighborhood during the fabrication process, so that their uniformity is much more easily obtained. Correspondingly all memory cells 211 display the same electrical characteristics with very little dispersion because the systematic differences observed for memory cells on border word lines have been avoided. Moreover, second source selection transistors and second drain selection transistors have a well controlled threshold voltage, whose value depends on fabrication process steps impacting parameters such as the gate oxide thickness and the channel doping concentration. Any threshold voltage variation is therefore excluded and optimum repeatability can be achieved for the life of the product embedding a NAND string according to the invention.

Figure 7:
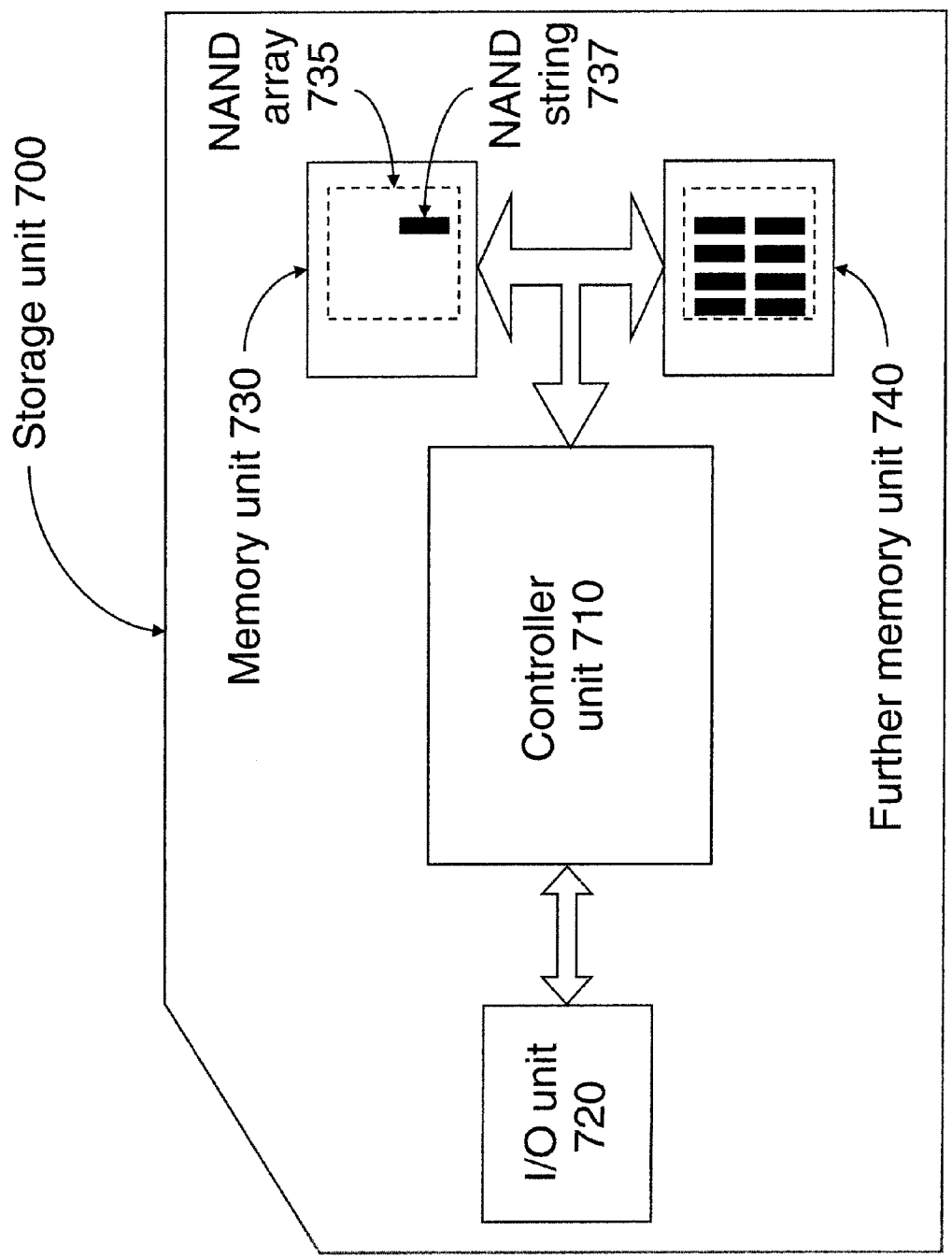
FIG. 7 is a schematic representation of a storage unit according to an embodiment of the invention.

FIG. 7 illustrates an embodiment of a storage unit utilizing the above described NAND string. Storage unit 700, such as a memory card or a USB (Universal Serial Bus) key, includes a controller unit 710 to manage the various components of the storage unit 700. An Input/Output unit 720 coupled to the controller unit 710 receives data and/or commands from, and provides data and/or status information to, entities outside of the storage unit 700. The storage unit 700 also includes a memory unit 730 to store data and/or program instructions. The memory unit 730 includes a NAND memory array 735 with a NAND string 737 comprising a memory cell in series with a first and a second source selection transistor, according to any one of the embodiments described above. In one embodiment, the memory cell is also in series with a first and a second drain selection transistor. One or more further memory units 740 may also be present to increase the total data storage capacity of the storage unit 700.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. An NAND string comprising:
    at least one memory cell;
    a first selection transistor
    a second selection transistor coupled between the at least one memory cell and the first selection transistor, wherein the second selection transistor has a pre-defined threshold voltage,
    wherein the second selection transistor comprises:
        a channel region between a source region and a drain region;
        a gate region overlapping the channel region; and a gate dielectric layer separating the gate region from the channel region, wherein the gate region comprises first to third layers, each of the first to third layers having conductive material, wherein the first layer is disposed in the second layer, contains an interpoly dielectric layer at a sidewall of the first layer and is in direct contact with the third layer on a top surface of the first layer, the second layer is in direct contact with the third layer.

2. The NAND string of claim 1, further comprising:
a third selection transistor; and
a fourth selection transistor coupled between the third selection transistor and the at least one memory cell.

3. The NAND string of claim 2, wherein a source of the first selection transistor is coupled to a source terminal of the NAND string.

4. The NAND string of claim 2, wherein a drain of the third selection transistor is coupled to a drain terminal of the NAND string.

5. The NAND string of claim 2, wherein the fourth selection transistor comprises:
a second channel region between a second source region and a second drain region;
a second gate region overlapping the second channel region; and
a second gate dielectric layer separating the second gate region from the second channel region, wherein the second gate region comprises first to third layers, each of the first to third layers of the second gate region having conductive material, wherein
the first layer of the second gate region is disposed in the second layer of the second gate region, contains an interpoly dielectric layer at a sidewall of the first layer of the second gate region and is in direct contact with the third layer of the second gate region on a top surface of the first layer of the second gate region, the second layer of the second gate region is in direct contact with the third layer of the second gate region.

6. A memory system comprising:
a controller unit;
an Input/Output unit interfaced with the controller unit to communicate data externally; and
a memory unit interfaced with the controller unit, the memory unit including a NAND string comprising:
at least one memory element;
a first selection transistor; and
a second selection transistor coupled between the at least one memory element and the first selection transistor, wherein the second selection transistor has a pre-defined threshold voltage, wherein the second selection transistor comprises:
a channel region between a source region and a drain region;
a gate region overlapping the channel region; and
a gate dielectric layer separating the gate region from the channel region,
wherein the gate region comprises first to third layers, each of the first to third layers having conductive material,
wherein the first layer is disposed in the second layer, contains an interpoly dielectric layer at a sidewall of the first layer and is in direct contact with the third layer on a top surface of the first layer, and the second layer is in direct contact with the third layer.

7. The memory system of claim 6, wherein the NAND string further comprises:
a third selection transistor; and
a fourth selection transistor coupled between the third selection transistor and the at least one memory element.

8. The memory system of claim 7, wherein a source of the first selection transistor is coupled to a source terminal of the NAND string and a drain of the third selection transistor is coupled to a drain terminal of the NAND string.

9. The memory system of claim 7, wherein the fourth selection transistor comprises:
a second channel region between a second source region and a second drain region;
a second gate region overlapping the second channel region; and
a second gate dielectric layer separating the second gate region from the second channel region, wherein the second gate region comprises first to third layers, each of the first to third layers of the second gate region having conductive material,
wherein the first layer of the second gate region disposed in the second layer of the second gate region contains an interpoly dielectric layer at a sidewall of the first layer of the second gate region and is in direct contact with the third layer of the second gate region on a top surface of the first layer of the second gate region, the second layer of the second gate region is in direct contact with the third layer of the second gate region.

10. A memory device comprising:
a plurality of serially connected memory cells in a NAND string;
a first selection transistor on a source side of the NAND string;
a second selection transistor interposed between the plurality of serially connected memory cells and the first selection transistor on the source side of the NAND string; and
a third selection transistor on a drain side of the NAND string, wherein the second transistor has a pre-defined threshold voltage, wherein the second selection transistor comprises:
a channel region between a source region and a drain region;
a gate region overlapping the channel region; and
a gate dielectric layer separating the gate region from the channel region,
wherein the gate region comprises first to third layers, each of the first to third layers having conductive material,
wherein the first layer is disposed in the second layer, contains an interpoly dielectric layer at a sidewall of the first layer and is in direct contact with the third layer on a top surface of the first layer, the second layer is in direct contact with the third layer.

* * * * *